(12) United States Patent
Jia et al.

(10) Patent No.: US 12,046,664 B2
(45) Date of Patent: Jul. 23, 2024

(54) VERTICAL SEMICONDUCTOR STRUCTURE WITH INTEGRATED SAMPLING STRUCTURE AND METHOD FOR MANUFACTURING SAME

(71) Applicant: WUXI CHINA RESOURCES HUAJING MICROELECTRONICS CO., LTD., Jiangsu (CN)

(72) Inventors: Pengfei Jia, Jiangsu (CN); Qiang Rui, Jiangsu (CN); Wei Li, Jiangsu (CN)

(73) Assignee: WUXI CHINA RESOURCES HUAJING MICROELECTRONICS CO., LTD., Jiangsu (CN)

( * ) Notice: Subject to any disclaimer, the term of this patent is extended or adjusted under 35 U.S.C. 154(b) by 0 days.

(21) Appl. No.: 18/286,152

(22) PCT Filed: May 20, 2022

(86) PCT No.: PCT/CN2022/094129
§ 371 (c)(1),
(2) Date: Oct. 9, 2023

(87) PCT Pub. No.: WO2022/253009
PCT Pub. Date: Dec. 8, 2022

(65) Prior Publication Data
US 2024/0088273 A1  Mar. 14, 2024

(30) Foreign Application Priority Data

Jun. 4, 2021 (CN) .......................... 202110624444.2

(51) Int. Cl.
*H01L 29/739* (2006.01)
*H01L 29/08* (2006.01)
(Continued)

(52) U.S. Cl.
CPC ...... *H01L 29/7396* (2013.01); *H01L 29/0856* (2013.01); *H01L 29/452* (2013.01); *H01L 29/66333* (2013.01)

(58) Field of Classification Search
CPC ............. H01L 29/7396; H01L 29/0856; H01L 29/452; H01L 29/66333;
(Continued)

(56) References Cited

U.S. PATENT DOCUMENTS

2015/0226787 A1* 8/2015 Mankel .................... G01K 7/01
                                                      702/64
2020/0020800 A1  1/2020 Kumada et al.
2022/0084825 A1* 3/2022 Takahashi ......... H01L 29/66348

FOREIGN PATENT DOCUMENTS

CN    103762231 A    4/2014
CN    106298917 A    1/2017
(Continued)

*Primary Examiner* — Shahed Ahmed
(74) *Attorney, Agent, or Firm* — Global IP Services; Tianhua Gu (57) ABSTRACT

A vertical semiconductor structure with an integrated sampling structure and a method for manufacturing the same; the vertical semiconductor structure includes a vertical-semiconductor-structure unit cell, a sampling unit cell, a control electrode, a first electrode, a second electrode, and a sampling electrode. The sampling electrode performs real-time sampling of a voltage difference between the first electrode and the second electrode; a PN junction is formed between a first/second P-type diffusion region and a second N-type base region, which forms a potential barrier blocking electron emission from the sampling electrode. Therefore, a voltage signal of the sampling electrode is input into a protection circuit, which detects whether the vertical-semiconductor-structure unit cell is desaturated when it determines that the unit cell is in the open state. Second, a sampling resistor is connected between the sampling elec- (Continued)

trode and the first electrode to ensure the stable operation of the sampling unit cell.

16 Claims, 9 Drawing Sheets

(51) Int. Cl.
*H01L 29/45* (2006.01)
*H01L 29/66* (2006.01)

(58) Field of Classification Search
CPC .................. H01L 29/66325–66348; H01L 29/7393–7398; H01L 29/083–0839; H01L 2924/13055; H01L 2924/13072–13076; H01L 22/10–14; H01L 22/30–34
See application file for complete search history.

(56) References Cited

FOREIGN PATENT DOCUMENTS

| | | | |
|---|---|---|---|
| CN | 108767006 A | 11/2018 | |
| CN | 110875309 A | 3/2020 | |

\* cited by examiner

| providing a semiconductor substrate, wherein the semiconductor substrate comprises an N-type base region, the N-type base region comprises a first N-type base region and a second N-type base region, wherein the first N-type base region is used to form a vertical-semiconductor-structure unit cell, and the second N-type base region is used to form a sampling unit cell; forming a first trench in the first N-type base region and forming a control region in the first trench | S1 |
|---|---|
| forming a P-type well region within the first N-type base region, wherein a depth of the P-type well region extending into the first N-type base region is less than a depth of the first trench extending into the first N-type base region; forming a first P-type diffusion region and a second P-type diffusion region within the second N-type base region, wherein an electron channel is formed between the first P-type diffusion region and the second P-type diffusion region | S2 |
| forming a P-type ohmic contact region and N-type source regions in an upper part of the P-type well region, wherein the N-type source regions are disposed on two sides of the P-type ohmic contact region; forming an N-type ohmic contact region in an upper part of the electron channel | S3 |
| forming a first N-type buffer layer and a first P-type collector region below the first N-type base region; forming a second N-type buffer layer and a first P-type collector region below the second N-type base region | S4 |
| forming a control electrode over the control region; forming an emitter over the P-type ohmic contact region, the N-type source regions, the first P-type diffusion region, and the second P-type diffusion region; forming a sampling electrode over the N-type ohmic contact region; and forming a collector over the first P-type collector region and the second P-type collector region | S5 |

VERTICAL SEMICONDUCTOR STRUCTURE WITH INTEGRATED SAMPLING STRUCTURE AND METHOD FOR MANUFACTURING SAME

CROSS REFERENCE TO RELATED PATENT APPLICATION

The present application is the US national stage of PCT/CN2022/094129 filed on May 20, 2022, which claims the priority of the Chinese patent application No. 202110624444.2 filed on Jun. 4, 2021, which application is incorporated herein by reference.

FIELD OF THE INVENTION

The present disclosure generally relates to the technical field of semiconductor devices and, in particular, to a vertical semiconductor structure with an integrated sampling structure and a method for manufacturing the same.

BACKGROUND OF THE INVENTION

Vertical semiconductor structures, such as insulated-gate bipolar transistors (IGBTs), differ from planar semiconductor structures. By having channels perpendicular to the substrate, they can effectively increase carrier concentration, reduce on-state voltage drop and increase current density. Currently, they are gradually becoming the dominant power device. An IGBT is a composite fully-controlled voltage-driven power semiconductor device composed of a bipolar junction transistor (BJT) and an insulated-gate metal-oxide-semiconductor field-effect transistor (MOSFET). It combines the voltage control of MOSFET and the current modulation of BJT, and has the advantages of high input impedance, low switching loss, fast speed, and low voltage drive power. IGBTs are widely used in fields like power transmission and transformation, high-speed train traction, industrial drives, and clean energy.

Vertical semiconductor structures have the characteristics of high voltage and large current. In use, they may encounter short-circuits, which means that the device will be subjected to both high voltage and large current at the same time and may be damaged within microseconds due to heating.

At present, some commonly used short-circuit protection methods include desaturation detection and the use of Hall current sensors to monitor channel current and provide protection. For example, desaturation detection for an IGBT involves sampling its $V_{CE}$ voltage and uses desaturation characteristics during a short circuit to determine whether the IGBT is in a short-circuit state. Hall current sensors determine whether an IGBT is in a short-circuit state by detecting if the current during a short circuit exceeds its normal operating current.

Hall current sensors have the disadvantage of having a high delay and large size. Desaturation detection requires peripheral circuits to sample high voltage above several hundred volts, which further requires high-voltage diodes and other protective measures to prevent high voltage from directly entering the drive. Therefore, the cost of peripheral circuits is relatively high.

SUMMARY OF THE INVENTION

The present disclosure provides a vertical semiconductor structure with an integrated sampling structure and a method for manufacturing the same to solve problems in the related technology.

A first aspect of the present disclosure provides a vertical semiconductor structure with an integrated sampling structure, comprising:
  a vertical-semiconductor-structure unit cell, comprising a first N-type base region, a P-type well region extending into the first N-type base region, a control region extending from the P-type well region into the first N-type base region, a P-type ohmic contact region and two N-type source regions located above the P-type well region, wherein the two N-type source regions are located on two sides of the P-type ohmic contact region, and a first N-type buffer layer located below the first N-type base region;
  a sampling unit cell, comprising a second N-type base region, a first P-type diffusion region and a second P-type diffusion region extending into the second N-type base region, an electron channel formed between the first and second P-type diffusion regions, an N-type ohmic contact region located above the electron channel, and a second N-type buffer layer located below the second N-type base region;
  a control electrode, connected to the control region of the vertical-semiconductor-structure unit cell;
  a first electrode, connected to the P-type ohmic contact region and the two N-type source regions of the vertical-semiconductor-structure unit cell, and to the first and second P-type diffusion regions of the sampling unit cell;
  a second electrode, connected to the first N-type buffer layer of the vertical-semiconductor-structure unit cell and to the second N-type buffer layer of the sampling unit cell; and
  a sampling electrode, connected to the N-type ohmic contact region of the sampling unit cell.

Optionally, the vertical-semiconductor-structure unit cell is an IGBT and the first electrode is an emitter; wherein the vertical-semiconductor-structure unit cell further comprises a first P-type collector region located below the first N-type buffer layer, and the sampling unit cell further comprises a second P-type collector region located below the second N-type buffer layer; wherein the second electrode is a collector connected to the first P-type collector region of the vertical-semiconductor-structure unit cell, and to the second P-type collector region of the sampling unit cell.

Optionally, the vertical-semiconductor-structure unit cell is a VDMOS, the first electrode is a source, and the second electrode is a drain.

Optionally, the vertical semiconductor structure with an integrated sampling structure further comprises a sampling resistor, connected between the sampling electrode and the first electrode.

Optionally, the vertical semiconductor structure has a plurality of vertical-semiconductor-structure unit cells connected in parallel, and a plurality of sampling unit cells connected in parallel.

Optionally, the second N-type base region has a first diffusion blocking region and a second diffusion blocking region, and the first diffusion blocking region and the second diffusion blocking region are adjacent to the electron channel, respectively; wherein the first P-type diffusion region is located on a side of the first diffusion blocking region away from the electron channel, and the second P-type diffusion region is located on a side of the second diffusion blocking region away from the electron channel.

Optionally, each of the first diffusion blocking region and the second diffusion blocking region comprises a conductive material region and an insulating material layer disposed on a side wall of the conductive material region.

Optionally, the conductive material region is electrically connected to the control region of the vertical-semiconductor-structure unit cell.

Optionally, each of the first diffusion blocking region and the second diffusion blocking region comprises an insulating material region and an insulating material layer disposed on a side wall of the insulating material region.

A second aspect of the present disclosure provides a method for manufacturing a vertical semiconductor structure with an integrated sampling structure, comprising:

providing a semiconductor substrate, wherein the semiconductor substrate comprises an N-type base region, the N-type base region comprises a first N-type base region and a second N-type base region, wherein the first N-type base region is used to form a vertical-semiconductor-structure unit cell, and the second N-type base region is used to form a sampling unit cell; forming a first trench in the first N-type base region and forming a control region in the first trench;

forming a P-type well region within the first N-type base region, wherein a depth of the P-type well region extending into the first N-type base region is less than a depth of the first trench extending into the first N-type base region; forming a first P-type diffusion region and a second P-type diffusion region within the second N-type base region, wherein an electron channel is formed between the first P-type diffusion region and the second P-type diffusion region;

forming a P-type ohmic contact region and N-type source regions in an upper part of the P-type well region, wherein the N-type source regions are disposed on two sides of the P-type ohmic contact region; forming an N-type ohmic contact region in an upper part of the electron channel;

forming a first N-type buffer layer below the first N-type base region; forming a second N-type buffer layer below the second N-type base region; and forming a control electrode over the control region; forming a first electrode over the P-type ohmic contact region, the N-type source regions, the first P-type diffusion region, and the second P-type diffusion region; forming a sampling electrode over the N-type ohmic contact region; and forming a second electrode over the first N-type buffer layer and the second N-type buffer layer.

Optionally, the forming of the N-type source regions in the upper part of the P-type well region is performed in the same process as the forming of the N-type ohmic contact region in the upper part of the electron channel; and/or the forming of the first N-type buffer layer below the first N-type base region is performed in the same process as the forming of the second N-type buffer layer below the second N-type base region; and/or the forming of the control electrode over the control region, the forming of first electrode over the P-type ohmic contact region, the N-type source regions, the first P-type diffusion region, and the second P-type diffusion region, and the forming of the sampling electrode over the N-type ohmic contact region are performed in the same process.

Optionally, the vertical-semiconductor-structure unit cell is an IGBT and the first electrode is an emitter;

wherein the method further comprises forming a first P-type collector region below the first N-type buffer layer, and forming a second P-type collector region below the second N-type buffer layer;

wherein the second electrode is a collector connected to the first P-type collector region of the vertical-semiconductor-structure unit cell, and to the second P-type collector region of the sampling unit cell.

Optionally, the vertical-semiconductor-structure unit cell is a VDMOS, the first electrode is a source, and the second electrode is a drain.

Optionally, the method further comprises: before the forming of the first P-type diffusion region and the second P-type diffusion region within the second N-type base region, forming a first diffusion blocking region and a second diffusion blocking region within the second N-type base region, respectively, wherein the first diffusion blocking region and the second diffusion blocking region are adjacent to the electron channel, respectively.

Optionally, the forming of the first diffusion blocking region and the second diffusion blocking region within the second N-type base region comprises: forming a second trench and a third trench in the second N-type base region, forming the first diffusion blocking region in the second trench, and forming the second diffusion blocking region in the third trench.

Optionally, the forming of the first trench in the first N-type base region and the forming of the second trench and the third trench in the second N-type base region are performed in the same process; the forming of the control region in the first trench, the forming of the first diffusion blocking region in the second trench, and the forming of the second diffusion blocking region in the third trench are performed in the same process.

The present disclosure has the following beneficial effects:

first, the sampling electrode may perform real-time sampling of a voltage difference between the first electrode and the second electrode; a PN junction is formed between a first P-type diffusion region and a second N-type base region of the sampling unit cell, as well as between a second P-type diffusion region and a second N-type base region. These PN junctions form a potential barrier that blocks electron emission from the sampling electrode. Therefore, instead of directly sampling the strong electric $V_{CE}$, the voltage signal of the sampling electrode is input into a protection circuit, and when the protection circuit determines that the vertical-semiconductor-structure unit cell is in an open state, it can safely and quickly detect whether vertical-semiconductor-structure unit cell is in an unsaturated state. Additionally, this simplifies peripheral circuits. Second, in the sampling unit cell, a sampling resistor is connected in series between the sampling electrode and the first electrode to convert a current signal into a voltage signal. When the voltage difference between the sampling electrode and the first electrode is large, this voltage difference is positive, at which time the electron channel has a high potential barrier that impedes electron emission and reduces the current in the electron channel, thereby reducing the voltage difference between the sampling electrode and the first electrode. After the voltage difference between the sampling electrode and the first electrode decreases, the potential barrier in the electron channel decreases and the current in the electron channel increases, thereby increasing the voltage difference between the sampling electrode and the first electrode. Under this negative feedback effect, the current at the sampling electrode will not increase sharply and the power of the sampling unit cell will not be too large to burn out the sampling unit cell. Therefore, introducing a sampling unit cell will not reduce performance reliability of the vertical semiconductor structure with an integrated structure, which ensures stable operation of the sampling unit cell.

| Reference numerals | |
|---|---|
| IGBTs with an integrated sampling structure 1, 2 | IGBT unit cell 11 |
| First N-type base region 110 | P-type well region 111 |
| Control region 112 | P-type ohmic contact region 113 |
| N-type source regions 114 | First N-type buffer layer 115 |
| First P-type collector region 116 | Sampling unit cell 12 |
| Second N-type base region 120 | First P-type diffusion region 121 |
| Second P-type diffusion region 122 | Electron channel 123 |
| N-type ohmic contact region 124 | Second N-type buffer layer 125 |
| Second P-type collector region 126 | Emitter 13 |
| Collector 14 | Sampling electrode 15 |
| Semiconductor substrate 10 | N-type base region 100 |
| First trench 112' | Interlayer insulation layer 16 |
| First diffusion blocking region 127 | Second diffusion blocking region 128 |
| Source 17 | Drain 18 |
| VDMOS unit cell 19 | |

DETAILED DESCRIPTION

In order to make the objects, features and advantages of the present disclosure more obvious and understandable, specific embodiments of the present disclosure are described in detail below in conjunction with the accompanying drawings.

Figure 1:
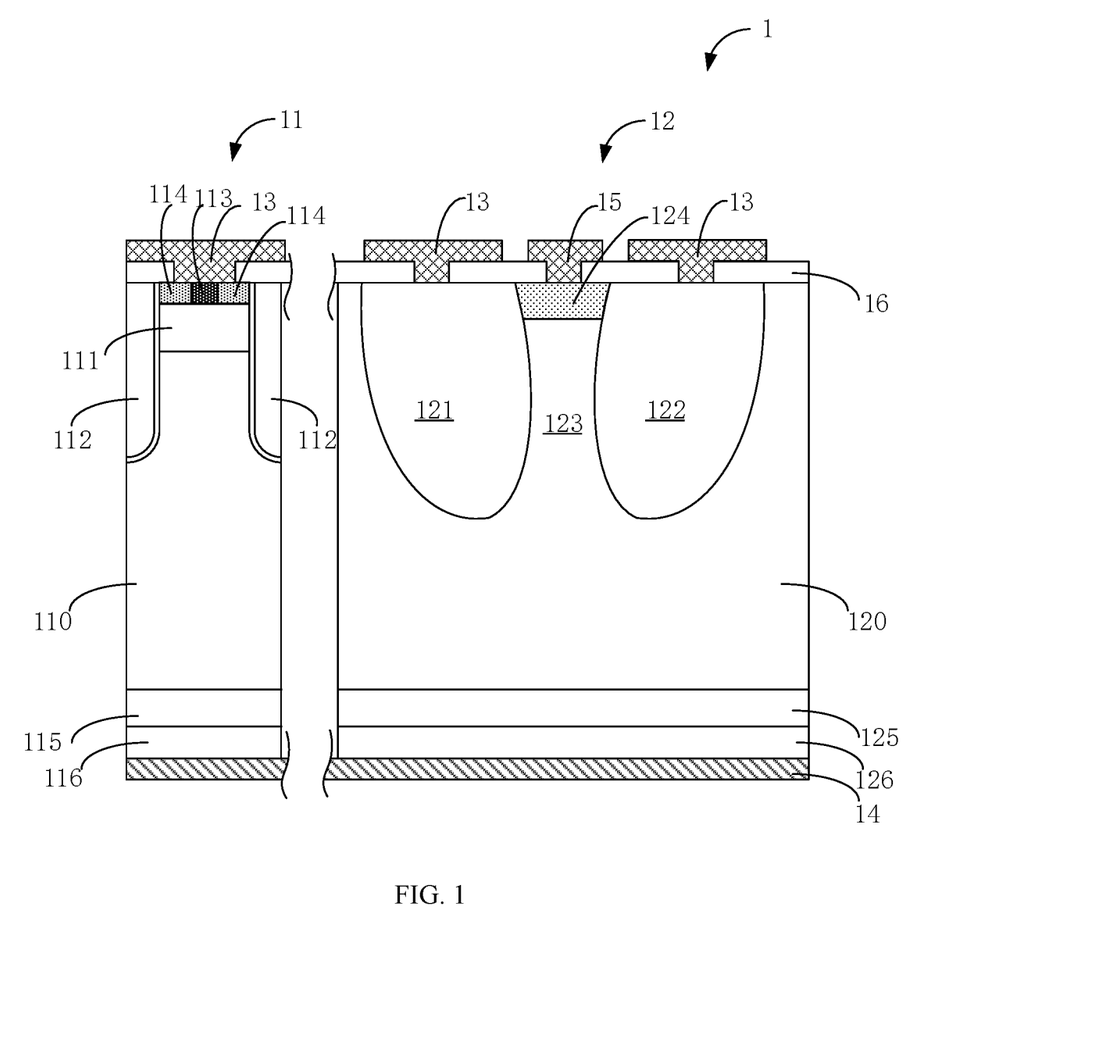
FIG. 1 is a schematic cross-sectional view of an IGBT with an integrated sampling structure according to a first embodiment of the present disclosure.

FIG. 1 is a schematic cross-sectional view of an Insulated-Gate Bipolar Transistor (IGBT) with an integrated sampling structure according to a first embodiment of the present disclosure.

Referring to FIG. 1, the IGBT 1 with the integrated sampling structure (aka, a vertical semiconductor structure), includes:

an IGBT unit cell 11 (aka, a vertical-semiconductor-structure unit cell), including: a first N-type base region 110, a P-type well region 111 extending into the first N-type base region 110, a control region 112 extending from the P-type well region 111 into the first N-type base region 110, a P-type ohmic contact region 113 and N-type source regions 114 disposed in an upper part of the P-type well region 111, wherein the N-type source regions 114 are located on two sides of the P-type ohmic contact region 113, a first N-type buffer layer 115 below the first N-type base region 110, and a first P-type collector region 116 below the first N-type buffer layer 115;

a sampling unit cell 12 including: a second N-type base region 120, a first P-type diffusion region 121 and a second P-type diffusion region 122 extending into the second N-type base region 120, an electron channel 123 formed between the first P-type diffusion region 121 and the second P-type diffusion region 122, an N-type ohmic contact region 124 disposed in an upper part of the electron channel 123, a second N-type buffer layer 125 below the second N-type base region 120, and a second P-type collector region 126 below the second N-type buffer layer 125;

a control electrode (not shown), connected to the control region 112 of the IGBT unit cell 11;

an emitter 13, connected to the P-type ohmic contact region 113 and the N-type source regions 114 of the IGBT unit cell 11, and to the first P-type diffusion region 121 and the second P-type diffusion region 122 of the sampling unit cell 12;

a collector 14, connected to the first P-type collector region 116 of the IGBT unit cell 11 and the second P-type collector region 126 of the sampling unit cell 12; and a sampling electrode 15, connected to the N-type ohmic contact region 124 of the sampling unit cell 12.

In an example, the control region 112 of the IGBT unit cell 11 may include a gate region and a gate insulation layer located on a side wall of the gate region. The control electrode is a gate and is connected to the gate region.

The first N-type base region 110 of the IGBT unit cell 11 and the second N-type base region 120 of the sampling unit cell 12 may be connected to each other. The first N-type buffer layer 115 of the IGBT unit cell 11 and the second N-type buffer layer 125 of the sampling unit cell 12 may be connected to each other. The first P-type collector region 116 of the IGBT unit cell 11 and the second P-type collector region 126 of the sampling unit cell 12 may be connected to each other.

The control region 112, the P-type ohmic contact region 113 and the N-type source regions 114 of the IGBT unit cell 11, and the first P-type diffusion region 121, the second P-type diffusion region 122 and the N-type ohmic contact region 124 of the sampling unit cell 12 can have an interlayer insulation layer 16 above them. The emitter 13, and the sampling electrode 15 are disposed over the interlayer insulation layer 16. The emitter 13 and the sampling electrode 15 are connected to the P-type ohmic contact region 113 and N-type source regions 114, and the first P-type diffusion region 121 and the second P-type diffusion region 122 through openings in the interlayer insulation layer 16. The collector 14 is connected to the first P-type collector region 116 and the second P-type collector region 126.

Figure 2:
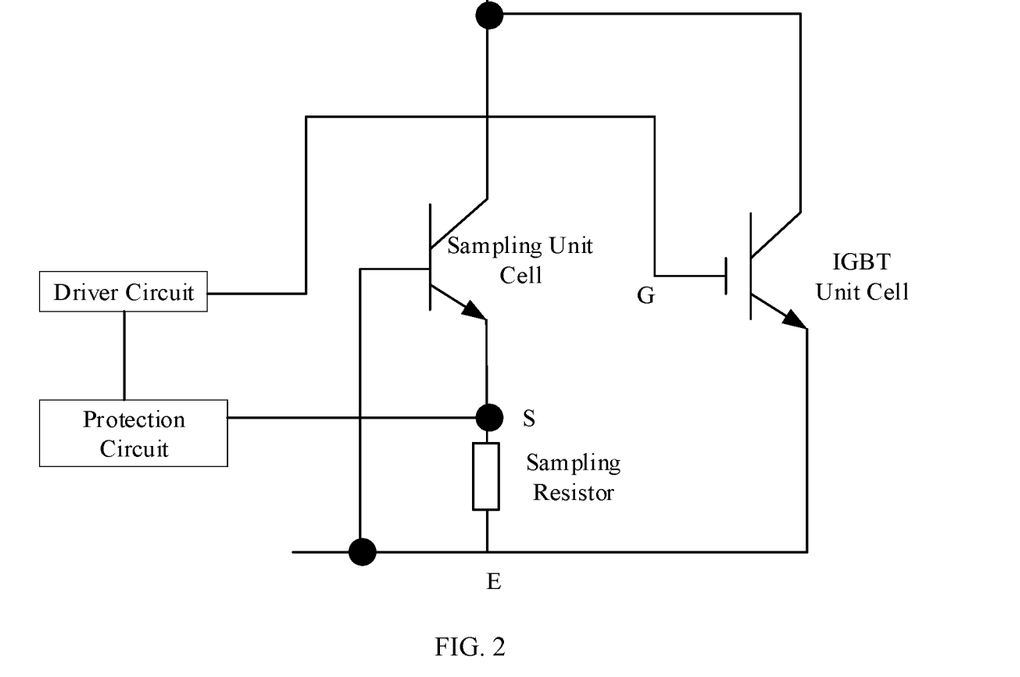
FIG. 2 is a circuit diagram of the IGBT with an integrated sampling structure in FIG. 1.

FIG. 2 is a circuit diagram of the IGBT with an integrated sampling structure in FIG. 1. Referring to FIG. 2, the IGBT operates as follows: after a driver circuit applies an on voltage to the control region 112 of the IGBT unit cell 11, an electron channel is formed between the N-type source regions 114 and the first N-type buffer layer 115 of the IGBT unit cell 11, and a voltage of the collector 14 is higher than a voltage of the emitter 13, so that the IGBT unit cell 11 conducts and is in the on state. The first P-type collector region 116 injects holes into the first N-type buffer layer 115 for conducive modulation, to reduce the on-state voltage of the device.

The sampling structure operates as follows: a potential of either the first P-type diffusion region 121 or the second P-type diffusion region 122 of the sampling unit cell 12 is the same as that of the emitter 13, the voltage of the collector 14 is higher than the voltage of the emitter 13, and the electron channel 123 conducts. Since PN junctions are formed between the first P-type diffusion region 121 and the second N-type base region 120, and between the second P-type diffusion region 122 and the second N-type base region 120, the PN junctions form potential barriers blocking the electron emission from the sampling electrode 15, and thus, a current of the electron channel 123 is smaller and a voltage signal from the sampling electrode 15 is weaker. The voltage signal from the sampling electrode 15 is input to a protection circuit, and when the protection circuit detects that the voltage signal is greater than a preset voltage and that the IGBT unit cell 11 has an on-state current, the IGBT unit cell 11 can be determined to be in a desaturated state, at which time the protection circuit can be disconnected.

During the operation of the above sampling structure, referring to FIG. 2, a sampling resistor is connected in series between the sampling electrode 15 and the emitter 13, which can convert a current signal into a voltage signal. When the voltage difference between the sampling electrode 15 and the emitter 13 is large, this voltage difference is positive, at which time the electron channel 123 has a high potential barrier that impedes electron emission and reduces the current in the electron channel 123. This reduces the voltage difference between the sampling electrode 15 and emitter 13. After the voltage difference between the sampling electrode 15 and the emitter 13 decreases, the potential barrier in the electron channel 123 decreases, and the current in the electron channel 123 increases, thereby increasing the voltage difference between the sampling electrode 15 and the emitter 13. This forms a negative feedback. Under this negative feedback effect, the current of the sampling electrode 15 will not increase sharply, and the power of the sampling unit cell 12 will not be too large to burn out the sampling unit cell 12. Therefore, introducing the sampling unit cell 12 will not cause a decrease in performance reliability of the entire semiconductor structure.

Figure 3:
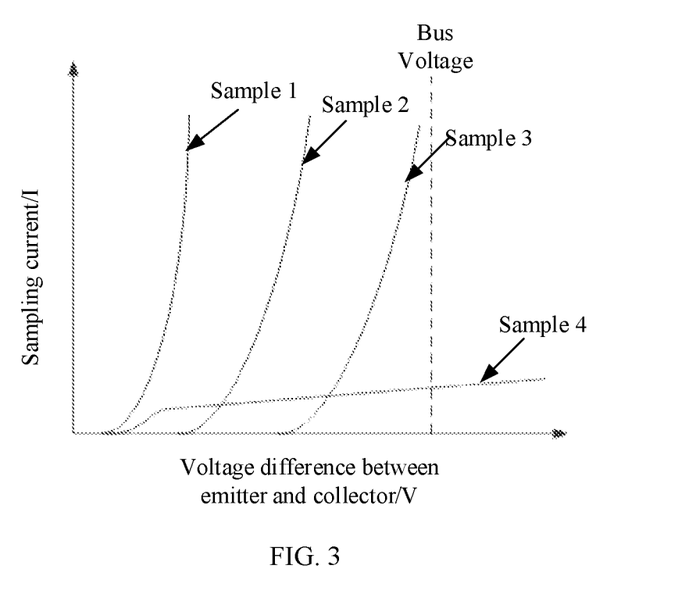
FIG. 3 is a graph showing the relationship between a sampling current and a voltage difference between an emitter and a collector of each sample in a control experiment.

In order to verify the above conclusion, a control experiment was conducted for the present disclosure. FIG. 3 is a graph showing the relationship between a sampling current and a voltage difference between an emitter and a collector of each sample in a control experiment. Sample 1 has a constant voltage difference of 0 V between the sampling electrode 15 and the emitter 13; Sample 2 has a constant voltage difference of −a V between the sampling electrode 15 and the emitter 13; Sample 3 has a constant voltage difference of −b V between the sampling electrode 15 and the emitter 13, wherein 0<a<b; and Sample 4 has a sampling resistor connected in series between the sampling electrode 15 and the emitter 13.

Referring to FIG. 3, it can be seen that sampling currents of Samples 1, 2 and 3 all increase exponentially with their respective voltage differences. The sampling current of Sample 4 does not increase sharply.

In FIG. 3, the "bus voltage" is a rated operating voltage of the circuit.

In one example, the IGBT 1 with the integrated sampling structure may include a sampling resistor, which is connected between the sampling electrode 15 and the emitter 13. In other examples, the sampling resistor may also be provided in the peripheral circuit.

In one example, one IGBT unit cell 11 corresponds to one sampling unit cell 12; in other words, one sampling unit cell 12 detects whether the corresponding one IGBT unit cell 11 is in a desaturated state. In other examples, there is a plurality of IGBT unit cells 11 connected in parallel, and there is also a plurality of sampling unit cells 12 connected in parallel, to increase sampling currents when detecting whether the IGBT unit cells 11 are in a desaturated state, and to improve the detection accuracy.

Figure 4:
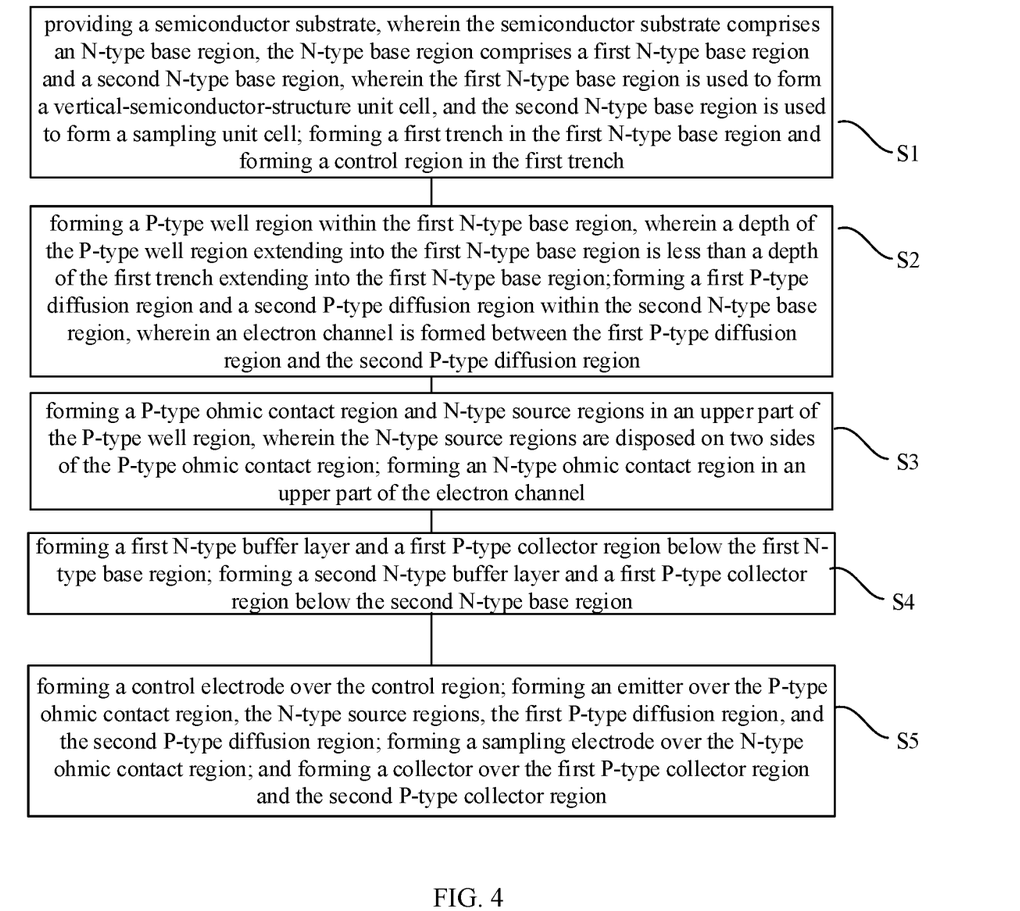
FIG. 4 is a flowchart of a method for manufacturing the IGBT with the integrated sampling structure in FIG. 1.

Another embodiment of the present disclosure provides a method for manufacturing the IGBT with an integrated sampling structure of FIG. 1. FIG. 4 is a flow chart of the method. FIGS. 5 to 8 are schematic diagrams of intermediate structures corresponding to the steps of FIG. 4.

Figure 5:
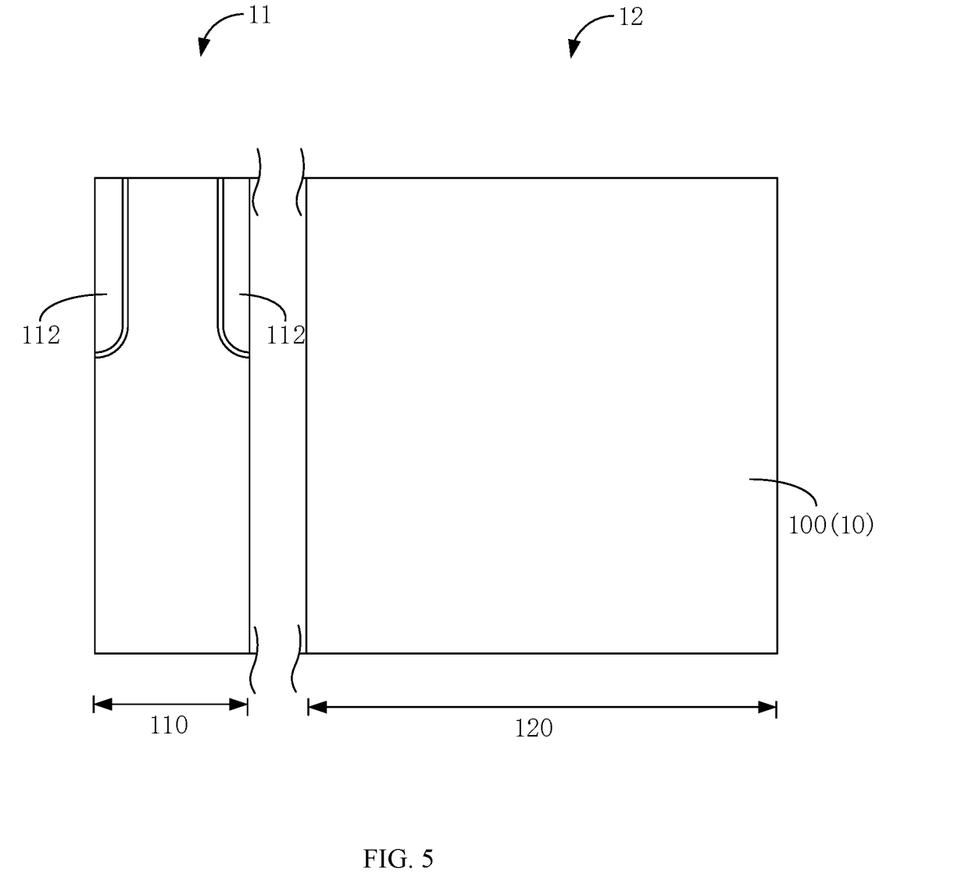
FIGS. 5 to 8 are schematic diagrams of intermediate structures corresponding to steps of FIG. 4.

First, referring to step S1 of FIG. 4, and FIG. 5, a semiconductor substrate 10 is provided, wherein the semiconductor substrate 10 includes an N-type base region 100 including a first N-type base region 110 and a second N-type base region 120, wherein the first N-type base region 110 is for forming an IGBT unit cell 11, and the second N-type base region 120 is for forming a sampling unit cell 12; a first trench 112' is formed in the first N-type base region 110, and a control region 112 is formed in the first trench 112'.

The first trench 112' may be formed by dry etching. In one example, the control region 112 may include a gate region and a gate insulation layer disposed on a side wall of the gate region. The gate insulation layer may be formed by thermal oxidation of the semiconductor substrate 10, and the material of the gate region may be doped polysilicon, formed by chemical vapor deposition.

Figure 6:
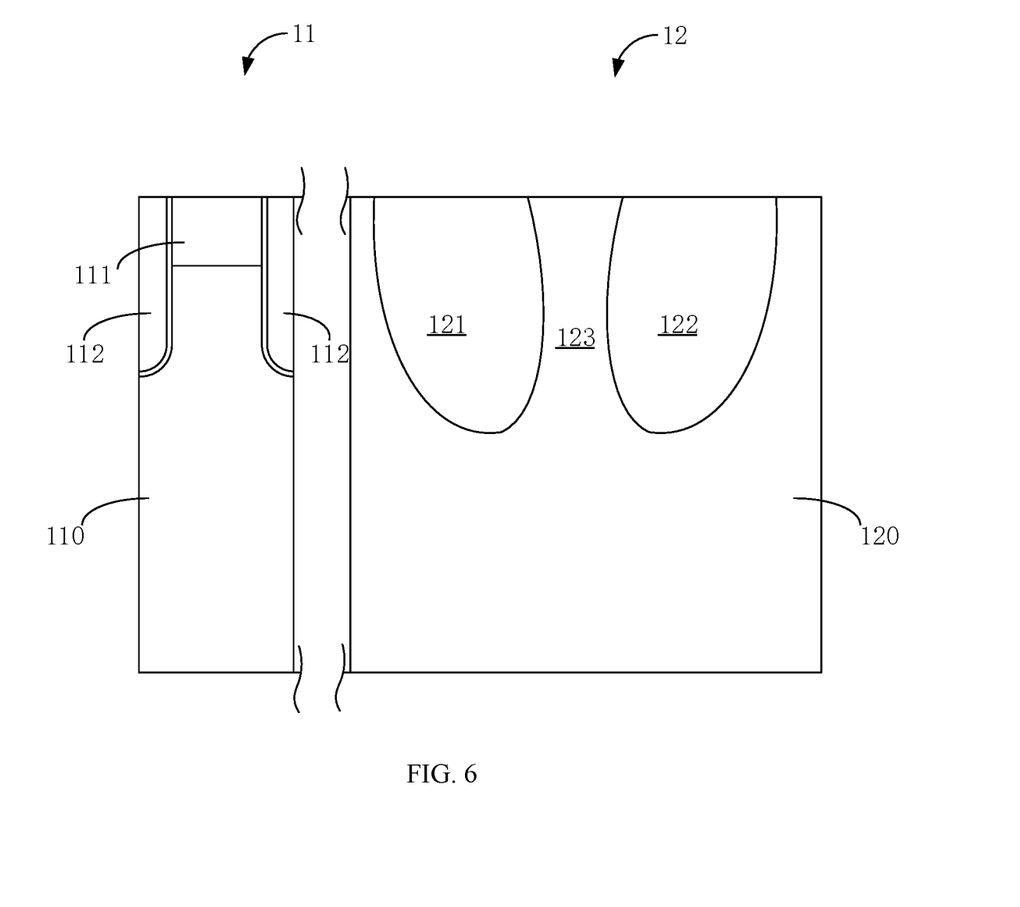

Next, referring to step S2 of FIG. 4, and FIG. 6, a P-type well region 111 is formed within the first N-type base region 110, a depth of the P-type well region 111 extending into the first N-type base region 110 is less than a depth of the first trench 112' extending into the first N-type base region 110; a first P-type diffusion region 121 and a second P-type diffusion region 122 are formed within the second N-type base region 120, and an electron channel 123 is formed between the first P-type diffusion region 121 and the second P-type diffusion region 122.

The P-type well region 111, the first P-type diffusion region 121, and the second P-type diffusion region 122 can all be formed by ion implantation. In one example, the depth of the P-type well region 111 is less than depths of the first P-type diffusion region 121 and the second P-type diffusion region 122, and thus, the first P-type diffusion region 121 and the second P-type diffusion region 122 can be formed before the P-type well region 111.

Figure 7:
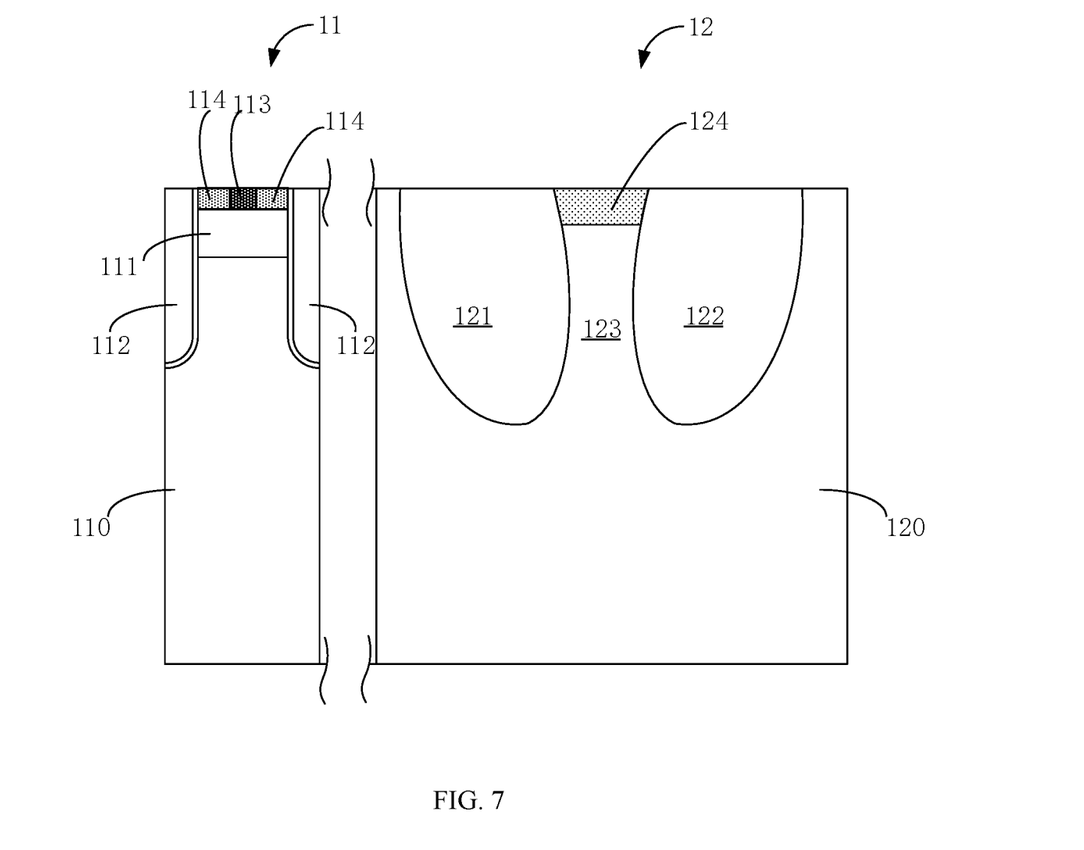

Next, referring to step S3 of FIG. 4, and FIG. 7, a P-type ohmic contact region 113 and N-type source regions 114 are formed in an upper part of the P-type well region 111, and the N-type source regions 114 are located on two sides of the P-type ohmic contact region 113; an N-type ohmic contact region 124 is formed in an upper part of the electron channel 123.

The P-type ohmic contact region 113, the N-type source regions 114, and the N-type ohmic contact region 124 can all be formed by ion implantation. The P-type ohmic contact region 113 is heavily doped by P-type ions, and the N-type source regions 114 and the N-type ohmic contact region 124 are heavily doped by N-type ions. Thus, the N-type source regions 114 and the N-type ohmic contact region 124 can be formed in the same process.

Figure 8:
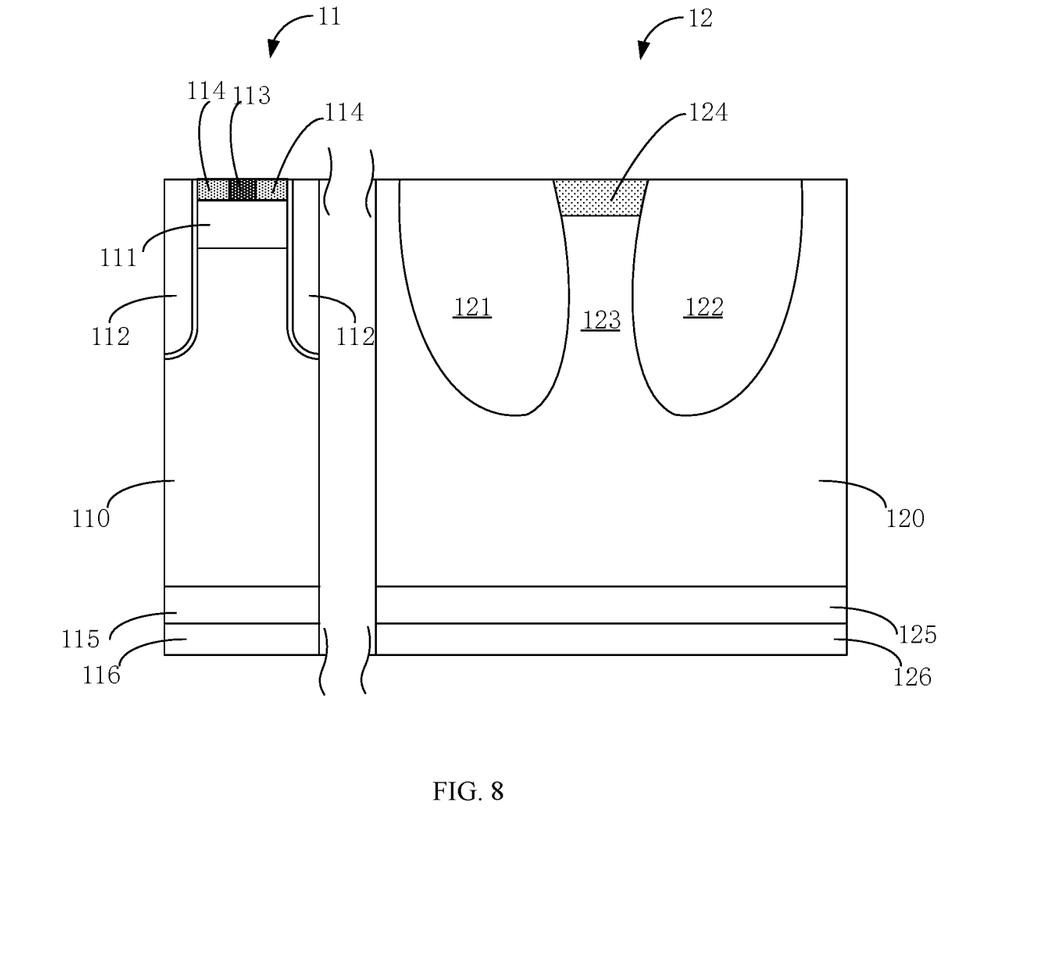

Next, referring to step S4 of FIG. 4, and FIG. 8, a first N-type buffer layer 115 and a first P-type collector region 116 are formed sequentially below the first N-type base region 110; and a second N-type buffer layer 125 and a second P-type collector region 126 are formed sequentially below the second N-type base region 120.

The first N-type buffer layer 115, the second N-type buffer layer 125, the first P-type collector region 116 and the second P-type collector region 126 can all be formed by ion implantation. The first N-type buffer layer 115 and the second N-type buffer layer 125 are heavily doped by N-type ions. The first P-type collector region 116 and the second P-type collector region 126 are heavily doped by P-type ions. Thus, the first N-type buffer layer 115 and the second N-type buffer layer 125 can be formed in the same process. The first P-type collector region 116 and the second P-type collector region 126 can be formed in the same process.

Next, referring to step S5 of FIG. 4, and FIG. 1, a control electrode is formed over the control region 112; an emitter 13 is formed over the P-type ohmic contact region 113, the N-type source regions 114, the first P-type diffusion region 121, and the second P-type diffusion region 122; a sampling electrode 15 is formed over the N-type ohmic contact region 124; a collector 14 is formed below the first P-type collector region 116 and the second P-type collector region 126, wherein specifically, the collector 14 is formed on surfaces of the first P-type collector region 116 and the second P-type collector region 126 facing away from the N-type base regions 110, 120.

The emitter 13 is shown on the cross section of FIG. 1, and the control electrode may be provided on other cross sections, which are not shown. In other words, the control electrode and the emitter 13 can be configured in a staggered manner.

The control region 112, the P-type ohmic contact region 113, and the N-type source regions 114 of the IGBT unit cell 11, and the first P-type diffusion region 121, the second P-type diffusion region 122, and the N-type ohmic contact region 124 of the sampling unit cell 12 may be provided with an interlayer insulation layer 16 over them. The interlayer insulation layer 16 has several openings within it that expose areas to be electrically connected.

Materials of the control electrode, the emitter 13, the collector 14, and the sampling electrode 15 may be metal, such as copper or aluminum. The control electrode, the emitter 13, and the sampling electrode 15 are fabricated on the same side of the semiconductor substrate 10 and can thus be formed in the same process.

The emitter 13, the collector 14, and the sampling electrode 15 are provided over the interlayer insulation layer 16.

Figure 9:
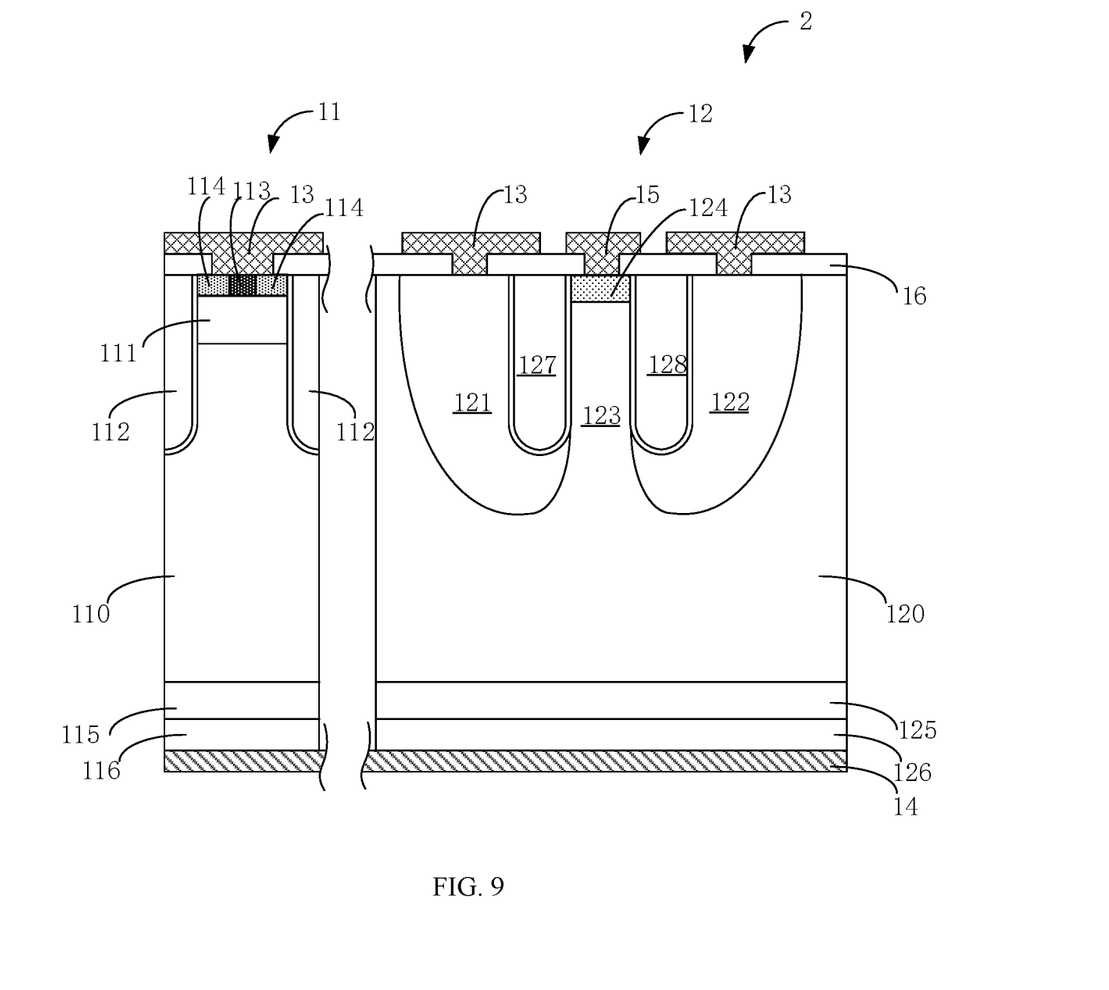
FIG. 9 is a schematic cross-sectional view of an IGBT with an integrated sampling structure according to a second embodiment of the present disclosure.

FIG. 9 is a schematic cross-sectional view of an IGBT with an integrated sampling structure according to a second embodiment of the present disclosure. Referring to FIG. 9, an IGBT 2 with an integrated sampling structure is substantially the same as the IGBT 1 with the integrated sampling structure in FIG. 1, except that in the IGBT 2 with an integrated sampling structure, the second N-type base region 120 has a first diffusion blocking region 127 and a second diffusion blocking region 128, wherein the first diffusion blocking region 127 and the second diffusion blocking region 128 are adjacent to the electron channel 123, respectively. The first P-type diffusion region 121 is located on a side of the first diffusion blocking region 127 away from the electron channel 123, and the second P-type diffusion region 122 is located on a side of the second diffusion blocking region 128 away from the electron channel 123.

The first diffusion blocking region 127 and the second diffusion blocking region 128 may prevent the first P-type diffusion region 121 and the second P-type diffusion region 122 from closing the electron channel 123.

In one example, each of the first diffusion blocking region 127 and the second diffusion blocking region 128 may include a conductive material region and an insulating material layer located on a side wall of the conductive material region.

Correspondingly, the method for manufacturing the IGBT2 with an integrated to sampling structure is substantially the same as the method for manufacturing the IGBT1 with an integrated sampling structure in FIG. 4, except that in the former method, before step S2 (i.e., the first P-type diffusion region 121 and the second P-type diffusion region 122 are formed in the second N-type base region 120), the first diffusion blocking region 127 and the second diffusion blocking region 128 are formed in the second N-type base region 120, wherein the first diffusion blocking region 127 and the second diffusion blocking region 128 are adjacent to the electron channel 123, respectively. Specifically, the method for manufacturing the IGBT2 with an integrated sampling structure may include: forming a second trench and a third trench in the second N-type base region 120, forming a first diffusion blocking region in the second trench, and forming a second diffusion blocking region 128 in the third trench.

The second trench and the third trench can be formed in the same process as the first trench 112' in step S1. The first trench 112', the second trench, and the third trench may be respectively filled with conductive materials in the same process.

The first diffusion blocking region 127 and the second diffusion blocking region 128 can be connected to a fixed voltage, which must not be too large in order to prevent breakdown of the interlayer insulation layer 16.

In some other examples, each of the first diffusion blocking region 127 and the second diffusion blocking region 128 may also include an insulating material region and an insulating material layer located on a side wall of the insulating material region.

Figure 10:
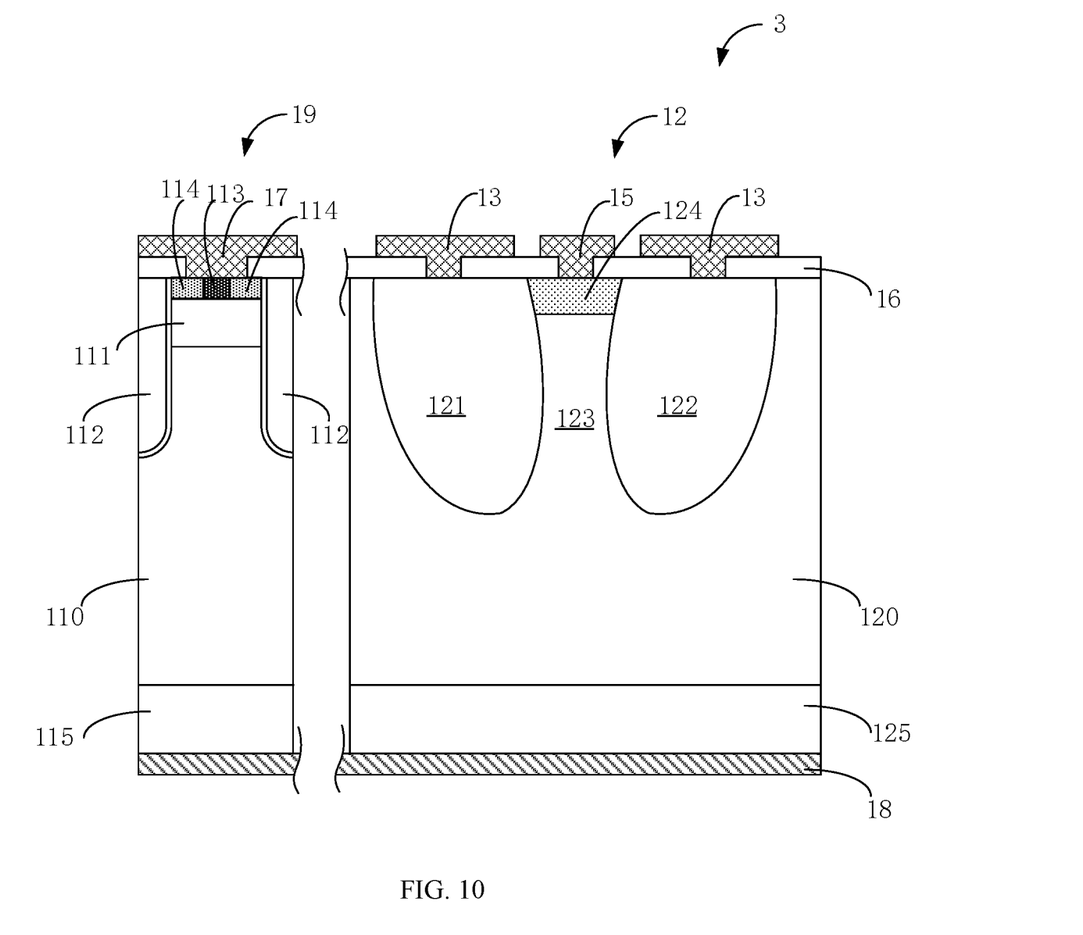
FIG. 10 is a schematic cross-sectional view of a VDMOS with an integrated sampling structure according to a third embodiment of the present disclosure.

FIG. 10 is a schematic cross-sectional view of a VDMOS with an integrated sampling structure according to a third embodiment of the present disclosure. Referring to FIG. 10, the VDMOS 3 with an integrated sampling structure is substantially the same as the IGBTs 1, 2 with an integrated sampling structure of FIGS. 1 and 9, differing only in that: the first P-type collector region 116 and the second P-type collector region 126 are omitted from the VDMOS 3 with an integrated sampling structure, and the emitter 13 is replaced by a source 17 and the collector 14 is replaced by a drain 18, wherein the drain 18 is connected to the first N-type buffer layer 115 and the second N-type buffer layer 125. In addition, the IGBT unit cell 11 is replaced with a VDMOS unit cell 19.

Although the present disclosure is disclosed as above, the present disclosure is not limited thereto. Any person skilled in the art may make various changes and modifications without departing from the spirit and scope of the present disclosure, and therefore the scope of protection of the present disclosure shall be subject to the scope defined by the claims.

What is claimed is:

1. A vertical semiconductor structure with an integrated sampling structure, comprising:
   a vertical-semiconductor-structure unit cell, comprising a first N-type base region, a P-type well region extending into the first N-type base region, a control region extending from the P-type well region into the first N-type base region, a P-type ohmic contact region and two N-type source regions located above the P-type well region, wherein the two N-type source regions are located on two sides of the P-type ohmic contact region, and a first N-type buffer layer located below the first N-type base region;

a sampling unit cell, comprising a second N-type base region, a first P-type diffusion region and a second P-type diffusion region extending into the second N-type base region, an electron channel formed between the first and second P-type diffusion regions, an N-type ohmic contact region located above the electron channel, and a second N-type buffer layer located below the second N-type base region;

a control electrode, connected to the control region of the vertical-semiconductor-structure unit cell;

a first electrode, connected to the P-type ohmic contact region and the two N-type source regions of the vertical-semiconductor-structure unit cell, and to the first and second P-type diffusion regions of the sampling unit cell;

a second electrode, connected to the first N-type buffer layer of the vertical-semiconductor-structure unit cell and to the second N-type buffer layer of the sampling unit cell; and a sampling electrode, connected to the N-type ohmic contact region of the sampling unit cell.

2. The vertical semiconductor structure with an integrated sampling structure according to claim 1, wherein the vertical-semiconductor-structure unit cell is an Insulated-Gate Bipolar Transistor (IGBT) and the first electrode is an emitter; wherein the vertical-semiconductor-structure unit cell further comprises a first P-type collector region located below the first N-type buffer layer, and the sampling unit cell further comprises a second P-type collector region located below the second N-type buffer layer; wherein the second electrode is a collector connected to the first P-type collector region of the vertical-semiconductor-structure unit cell, and to the second P-type collector region of the sampling unit cell.

3. The vertical semiconductor structure with an integrated sampling structure according to claim 1, wherein the vertical-semiconductor-structure unit cell is a Vertical Diffused Metal-Oxide Semiconductor (VDMOS), the first electrode is a source, and the second electrode is a drain.

4. The vertical semiconductor structure with an integrated sampling structure according to claim 1, further comprising: a sampling resistor, connected between the sampling electrode and the first electrode.

5. The vertical semiconductor structure with an integrated sampling structure according to claim 1, comprising a plurality of vertical-semiconductor-structure unit cells connected in parallel, and a plurality of sampling unit cells connected in parallel.

6. The vertical semiconductor structure with an integrated sampling structure according to claim 1, wherein the second N-type base region has a first diffusion blocking region and a second diffusion blocking region, and the first diffusion blocking region and the second diffusion blocking region are adjacent to the electron channel, respectively; wherein the first P-type diffusion region is located on a side of the first diffusion blocking region away from the electron channel, and the second P-type diffusion region is located on a side of the second diffusion blocking region away from the electron channel.

7. The vertical semiconductor structure with an integrated sampling structure according to claim 6, wherein each of the first diffusion blocking region and the second diffusion blocking region comprises a conductive material region and an insulating material layer disposed on a side wall of the conductive material region.

8. The vertical semiconductor structure with an integrated sampling structure according to claim 7, wherein the conductive material region is electrically connected to the control region of the vertical-semiconductor-structure unit cell.

9. The vertical semiconductor structure with an integrated sampling structure according to claim 6, wherein each of the first diffusion blocking region and the second diffusion blocking region comprises an insulating material region and an insulating material layer disposed on a side wall of the insulating material region.

10. A method for manufacturing a vertical semiconductor structure with an integrated sampling structure, comprising:
providing a semiconductor substrate, wherein the semiconductor substrate comprises an N-type base region, the N-type base region comprises a first N-type base region and a second N-type base region, wherein the first N-type base region is used to form a vertical-semiconductor-structure unit cell, and the second N-type base region is used to form a sampling unit cell;
forming a first trench in the first N-type base region and forming a control region in the first trench;
forming a P-type well region within the first N-type base region, wherein a depth of the P-type well region extending into the first N-type base region is less than a depth of the first trench extending into the first N-type base region; forming a first P-type diffusion region and a second P-type diffusion region within the second N-type base region, wherein an electron channel is formed between the first P-type diffusion region and the second P-type diffusion region;
forming a P-type ohmic contact region and N-type source regions in an upper part of the P-type well region, wherein the N-type source regions are disposed on two sides of the P-type ohmic contact region; forming an N-type ohmic contact region in an upper part of the electron channel;
forming a first N-type buffer layer below the first N-type base region; forming a second N-type buffer layer below the second N-type base region;
forming a control electrode over the control region; forming a first electrode over the P-type ohmic contact region, the N-type source regions, the first P-type diffusion region, and the second P-type diffusion region; forming a sampling electrode over the N-type ohmic contact region; and forming a second electrode over the first N-type buffer layer and the second N-type buffer layer.

11. The method for manufacturing a vertical semiconductor structure with an integrated sampling structure according to claim 10, wherein the forming of the N-type source regions in the upper part of the P-type well region is performed in the same process as the forming of the N-type ohmic contact region in the upper part of the electron channel; and/or
the forming of the first N-type buffer layer below the first N-type base region is performed in the same process as the forming of the second N-type buffer layer below the second N-type base region; and/or
the forming of the control electrode over the control region, the forming of first electrode over the P-type ohmic contact region, the N-type source regions, the first P-type diffusion region, and the second P-type diffusion region, and the forming of the sampling electrode over the N-type ohmic contact region are performed in the same process.

12. The method for manufacturing a vertical semiconductor structure with an integrated sampling structure according to claim 10, wherein the vertical-semiconductor-structure unit cell is an IGBT and the first electrode is an emitter;
wherein the method further comprises forming a first P-type collector region below the first N-type buffer layer, and forming a second P-type collector region below the second N-type buffer layer;
wherein the second electrode is a collector connected to the first P-type collector region of the vertical-semiconductor-structure unit cell, and to the second P-type collector region of the sampling unit cell.

13. The method for manufacturing a vertical semiconductor structure with an integrated sampling structure according to claim 10, wherein the vertical-semiconductor-structure unit cell is a VDMOS, the first electrode is a source, and the second electrode is a drain.

14. The method for manufacturing a vertical semiconductor structure with an integrated sampling structure according to claim 10, further comprising: before the forming of the first P-type diffusion region and the second P-type diffusion region within the second N-type base region, forming a first diffusion blocking region and a second diffusion blocking region within the second N-type base region, respectively, wherein the first diffusion blocking region and the second diffusion blocking region are adjacent to the electron channel, respectively.

15. The method for manufacturing a vertical semiconductor structure with an integrated sampling structure according to claim 14, wherein the forming of the first diffusion blocking region and the second diffusion blocking region within the second N-type base region comprises: forming a second trench and a third trench in the second N-type base region, forming the first diffusion blocking region in the second trench, and forming the second diffusion blocking region in the third trench.

16. The method for manufacturing a vertical semiconductor structure with an integrated sampling structure according to claim 15, wherein the forming of the first trench in the first N-type base region and the forming of the second trench and the third trench in the second N-type base region are performed in the same process; the forming of the control region in the first trench, the forming of the first diffusion blocking region in the second trench, and the forming of the second diffusion blocking region in the third trench are performed in the same process.

* * * * *